United States Patent
Gose et al.

(10) Patent No.: US 7,436,223 B2
(45) Date of Patent: *Oct. 14, 2008

(54) TECHNIQUE FOR IMPROVING NEGATIVE POTENTIAL IMMUNITY OF AN INTEGRATED CIRCUIT

(75) Inventors: Mark W. Gose, Kokomo, IN (US); John A. Grawcock, Kokomo, IN (US)

(73) Assignee: Delphi Technolopgies, Inc., Troy, MI (US)

( * ) Notice: Subject to any disclaimer, the term of this patent is extended or adjusted under 35 U.S.C. 154(b) by 90 days.

This patent is subject to a terminal disclaimer.

(21) Appl. No.: 11/261,310

(22) Filed: Oct. 28, 2005

(65) Prior Publication Data

US 2007/0096776 A1    May 3, 2007

(51) Int. Cl.
*H03B 1/00*    (2006.01)
(52) U.S. Cl. .................... 327/108; 327/427; 257/358
(58) Field of Classification Search ........... 327/427, 327/434, 540, 541, 543, 316; 257/368
See application file for complete search history.

(56) References Cited

U.S. PATENT DOCUMENTS

| | | | | |
|---|---|---|---|---|
| 4,682,047 | A * | 7/1987 | von Sichart | ............... 326/34 |
| 5,886,487 | A | 3/1999 | Khayat et al. | |
| 6,264,167 | B1 | 7/2001 | Hamazawa | |
| 6,815,794 | B2 | 11/2004 | Shin et al. | |
| 7,076,070 | B2 * | 7/2006 | Pearce et al. | ............... 381/120 |
| 7,208,985 | B2 * | 4/2007 | Yamashita | ............... 327/108 |

FOREIGN PATENT DOCUMENTS

DE    199 28 762    11/2000
EP    0 867 943    9/1998

OTHER PUBLICATIONS

Office Action mailed Jun. 28, 2007, for U.S. Appl. No. 11/107,084, filed by Glenn et al. on Apr. 14, 2005 (7 pages).

(Continued)

*Primary Examiner*—Tuan T. Lam
*Assistant Examiner*—Diana J Cheng
(74) *Attorney, Agent, or Firm*—Jimmy L. Funke

(57) ABSTRACT

An integrated circuit (IC) with negative potential protection includes a switch, a gate drive circuit and a comparator. The switch includes a double-diffused metal-oxide semiconductor (DMOS) cell formed in a first-type epitaxial pocket, which is formed in a second-type substrate. The switch also includes a second-type+ isolation ring formed in the substrate to isolate the first-type epitaxial pocket. An output of the gate drive circuit is coupled across a gate and a source of the switch. An output of the comparator is coupled to a second input of the gate drive circuit and a first input of the comparator receives a reference signal. A second input of the comparator is coupled to the epitaxial pocket. The comparator provides a turn-on signal that causes the switch to conduct current, when a signal at the second input of the comparator is below the reference signal.

20 Claims, 2 Drawing Sheets

OTHER PUBLICATIONS

European Search Report dated Apr. 24, 2008.
Gonnard o et al.: "Substrate current protection in smart power IC's " 12th. international symposium on power semiconductor devices and IC S. ISPSD 2000. Proceedings. Toulouse, France, May 22-25, 2000, international symposium on power semiconductor devices & IC's, New York, NY: IEEE, US, May 22, 2000 (May 22, 2000), pp. 169-172, XP000987853 ISBN: 0-78036269-1 section II, 2nd paragraph.

* cited by examiner

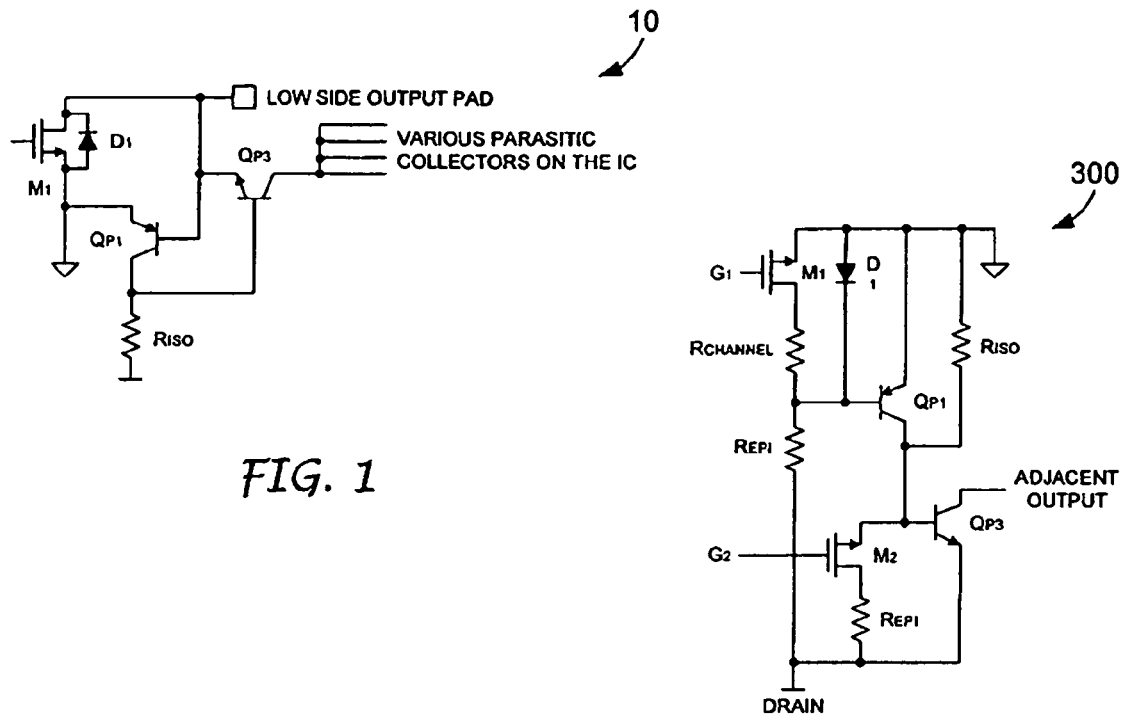
FIG. 1
FIG. 4
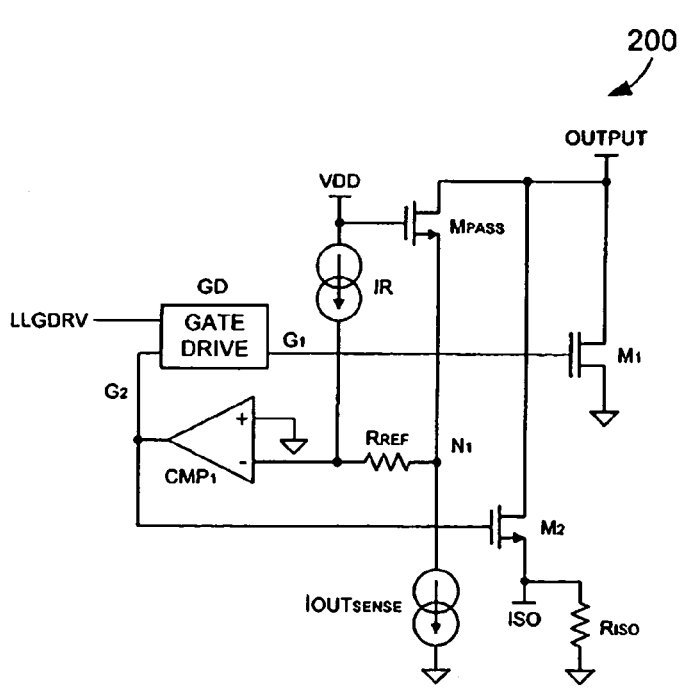
FIG. 3

TECHNIQUE FOR IMPROVING NEGATIVE POTENTIAL IMMUNITY OF AN INTEGRATED CIRCUIT

CROSS-REFERENCE TO RELATED APPLICATION

This application is related to, entitled TECHNIQUE FOR IMPROVING NEGATIVE POTENTIAL IMMUNITY OF AN INTEGRATED CIRCUIT, by Jack L. Glenn et al., filed on Apr. 15, 2005 (application Ser. No. 11/107,084.

TECHNICAL FIELD

The present invention is generally directed to a technique for improving negative potential immunity of an integrated circuit and, more specifically, to a technique for improving negative potential immunity of an integrated circuit that includes a plurality of drivers.

BACKGROUND OF THE INVENTION

A wide variety of drivers or switches, e.g., metal-oxide semiconductor field-effect transistors (MOSFETs), are utilized in motor vehicles to drive inductive loads, such as solenoids. In a typical application, a control signal, provided by a gate drive circuit, is applied across a gate and a source of a MOSFET to control energization of a solenoid that is coupled to a drain of the MOSFET. In modern motor vehicles, a motor vehicle chassis or frame has been electrically coupled to a negative or ground side of a battery. As such, most of the electrical loads within the vehicle have utilized the chassis as a current return path to the battery. Unfortunately, utilization of the chassis as a current return path, for multiple electrical loads, can result in potential differences along the chassis.

In most motor vehicles, one or more of the electrical loads in a motor vehicle may have one terminal tied to the battery and the other terminal tied to a drain of a MOSFET, e.g., an N-channel power double-diffused metal-oxide semiconductor (DMOS) driver, which is turned on in order to energize an associated load. As up-integration has become more prevalent, multiple of these power DMOS drivers have been integrated onto the same junction-isolated integrated circuit (IC) silicon die, along with associated gate drive circuitry, fault diagnostic circuitry and many other types of circuits, including digital logic.

A problem with this up-integrated approach occurs when an output terminal of one or more of the DMOS drivers is shorted to a negative potential, relative to the ground of the IC die (i.e., subjected to a short below ground (SBG)). This can occur, for example, due to the potential differences that exist along the chassis of the vehicle. Under this condition, circuits of the IC can malfunction with a variety of symptoms, such as adjacent drivers turning off when they should be on.

What is needed is a technique that reduces the likelihood of integrated circuit malfunction when an output terminal of a driver of an integrated circuit is taken to a negative potential.

SUMMARY OF THE INVENTION

One embodiment of the present invention is directed to an integrated circuit (IC) that includes negative potential protection. The IC includes a switch, a gate drive circuit and a comparator. The switch includes a double-diffused metal-oxide semiconductor (DMOS) cell formed in a first-type epitaxial pocket, which is formed in a second-type substrate. The switch also includes a second-type+ isolation ring formed in the substrate to isolate the first-type epitaxial pocket.

The gate drive circuit includes a first input, a second input and an output. The output of the gate drive circuit is coupled across a gate and a source of the switch. The comparator includes an output, a first input and a second input. The output of the comparator is coupled to the second input of the gate drive circuit, the first input of the comparator receives a reference signal and the second input of the comparator is coupled to the first-type epitaxial pocket, which functions as a drain of the switch. The comparator provides a turn-on signal to the gate drive circuit when a signal at the second input of the comparator is below the reference signal. The turn-on signal causes the gate drive circuit to provide another turn-on signal to the gate of the switch causing the switch to conduct current.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is an electrical schematic of a double-diffused metal-oxide semiconductor (DMOS) driver, including parasitic PNP and NPN transistors that are typically associated with the DMOS driver;

FIG. 3 is an electrical schematic of a circuit, constructed according to the present invention, for turning on a DMOS driver when a short below ground (SBG) is detected;

FIG. 4 is an electrical schematic depicting relevant portions of the circuit of FIG. 3 and including parasitic components usually associated with the DMOS driver of FIG. 3.

DESCRIPTION OF THE PREFERRED EMBODIMENTS

Figure 2:
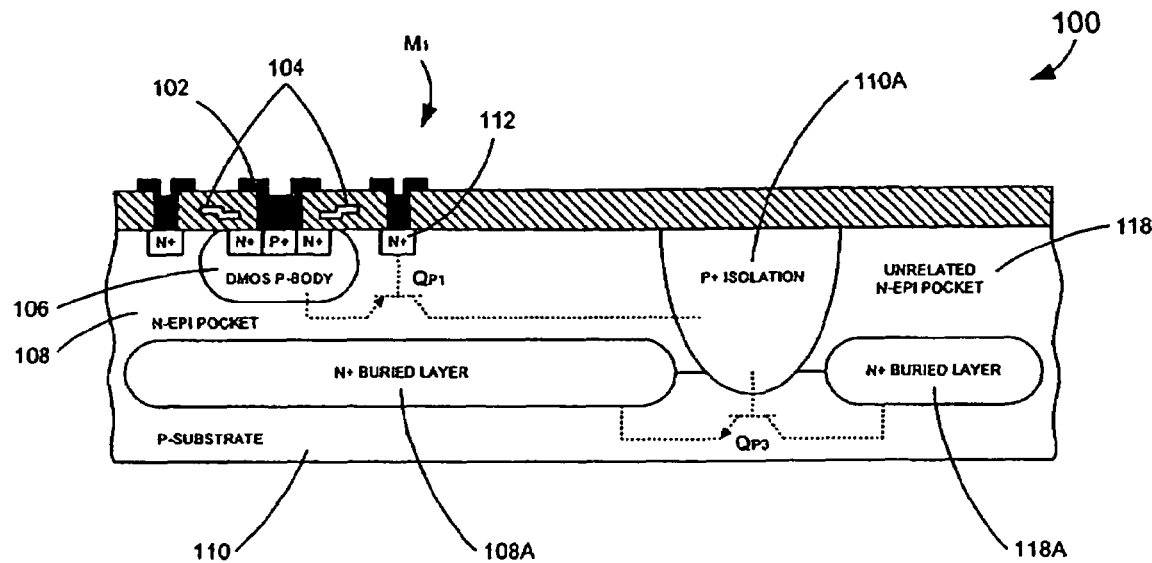
FIG. 2 is a cross-sectional view of a relevant portion of an integrated circuit (IC) including a conventional DMOS driver.

FIG. 1 depicts an exemplary electrical schematic 10 for a typical DMOS driver M1 (and its associated parasitic components). As is shown, the DMOS driver M1 has an associated parasitic PNP transistor QP1 and an associated parasitic NPN transistor QP3. With reference to FIG. 2, a relevant portion of integrated circuit (IC) 100 includes a DMOS driver M1 that has a source 102 and gate 104 formed within a DMOS P-type body 106 (collectively referred to herein as a DMOS cell). The P-type body 106 is formed in an N-type epitaxial pocket 108, which functions as a drain of the DMOS driver M1. When the drain of the driver M1 is taken to a sufficient negative voltage, e.g., −0.7 Volts, the junction between the pocket 108 (N-type+ buried layer 108A) and P-type substrate 110 (P-type+ isolation ring 110A) is forward biased. This forward biased junction acts as a base-emitter junction of the parasitic NPN transistor QP3. The collector of the parasitic NPN transistor QP3 can be any other N-type layer (e.g., N-type epitaxial pocket 118 and N-type+ buried layer 118A) within the IC 100. It should be appreciated that when current is pulled out of another epitaxial pocket (e.g., pocket 118), within the IC 100, malfunctions of the IC 100, such as adjacent output drivers turning off, may result.

With reference to FIGS. 3 and 4, an integrated circuit 200 may be designed to include a comparator CMP1 and a pass transistor Mpass, as well as the DMOS driver M1. With specific reference to FIG. 3, the comparator CMP1 is used to sense when the drain of the DMOS driver M1 is going below the IC ground, e.g., by a voltage equal to the product of the current IR and resistor Rref. The transistor Mpass is implemented to act as a pass device to transfer the DMOS driver M1 drain voltage to node N1, when the drain voltage is low, e.g., less than 0.1 Volts. As the drain voltage goes sufficiently below ground, the output of the comparator CMP1 goes high causing a gate drive circuit GD to turn the DMOS driver M1 on, by providing gate signal G1. This is desirable if the DMOS driver M1 is off when a short to negative voltage is detected.

Two benefits are realized by turning the DMOS driver M1 on into the short. First, referencing FIG. 4, the channel of the DMOS driver M1 acts to reduce the voltage between the base-emitter junction of the parasitic PNP transistor QP1 (through the resistive divider made up of resistances Rchannel and Repi). Thus, only a fraction of the negative potential on the drain terminal (drain in FIG. 4) appears at the base of the transistor QP1, keeping the transistor QP1 biased off. This prevents the transistor QP1 from providing additional base drive to the transistor QP3, which would result in increasing the leakage that would appear in an unrelated EPI pocket. Second, with the DMOS driver M1 on, its on-resistance (made up of resistances Rchannel and Repi) and the resistance of the conductor that shorts the drain to the negative potential of the chassis, acts as a resistive divider. Therefore, more of the voltage is dropped across the shorting conductor and, in turn, the DMOS driver M1 drain voltage is less negative.

Figure 5:
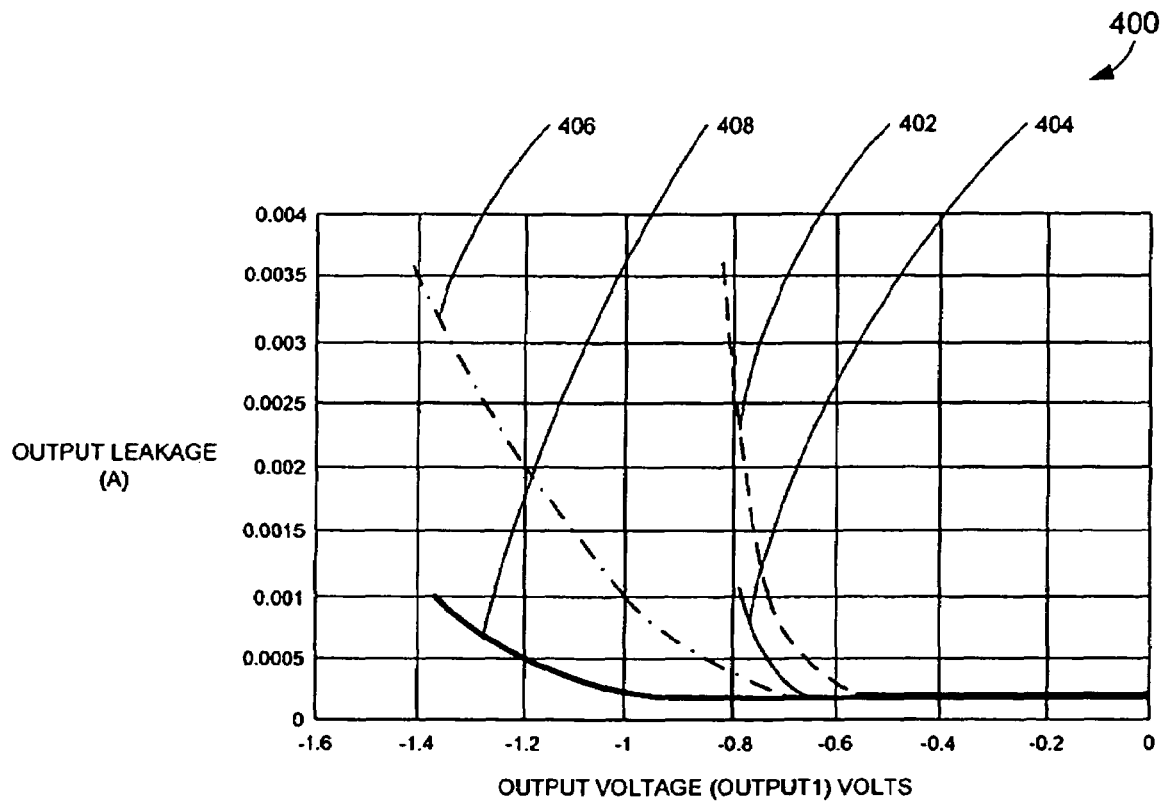
FIG. 5 is a graph with curves that illustrate the relationship between a negative voltage on a drain of a DMOS driver, constructed according to a present invention, and an output current leakage associated with an adjacent DMOS driver within the same IC.

The graph 400 of FIG. 5 includes curves 402, 404, 406 and 408 demonstrate the performance gain obtained by turning the DMOS driver M1 on when an SBG is detected. The curves 402 and 404 represent the current out of a second output pin (associated with another DMOS driver adjacent to the driver M1) of the IC 200 as a function of the negative potential applied to the drain of driver M1, with an associated DMOS driver (e.g., driver M1) turned off and on, respectively. The magnitude of this parasitic current represents the strength of the parasitic and the likelihood of disruption of the circuitry of the IC 200.

The curves 406 and 408 represent the parasitic current pulled into a second output pin (associated with another DMOS driver adjacent to the driver M1) as a function of the negative potential applied to one of a resistance, whose other side is tied to the first output pin (drain of the DMOS driver M1) with the DMOS driver M1 associated with the first output pin turned off and on, respectively. This resistance represents a practical minimum wiring resistance between the driver output and the actual short to vehicle chassis that results in negative potentials being tied to the IC. As is depicted, with the driver M1 turned on, the current of the adjacent DMOS driver is measurably less for negative voltages less than about −0.7 Volts, as compared to when the driver M1 is turned off.

While the discussion herein is directed to an IC with N-type epitaxial pockets and a P-type substrate, it should be appreciated that the types of the epitaxial pockets and substrate may be reversed. In this case, the other regions, discussed above, would also be reversed in type. As used herein, the terms "first-type" and "second-type" refer to opposite types. For example, if the first-type is N-type then the second-type is P-type. As is well know to those of ordinary skill in the art, an N-type semiconductor material is a semiconductor material in which the predominant charge carriers are electrons and an P-type semiconductor material is a semiconductor material in which the predominant charge carriers are holes (positive charges). As used herein a + sign indicates very heavy doping approaching the solid solubility limit. For example, an N-type+ region is an N-type region where the doping approaches the solid solubility region.

Accordingly, techniques have been described herein that advantageously reduce the likelihood of integrated circuit (IC) malfunction when an output terminal of a driver of an IC is taken to a negative potential. This is particularly advantageous in the automotive industry, which increasingly utilizes ICs that include multiple drivers to switch various inductive loads.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An integrated circuit having negative potential protection, comprising:
   a switch, comprising:
      a double-diffused metal-oxide semiconductor (DMOS) cell formed in a first-type epitaxial pocket, wherein the first-type epitaxial pocket is formed in a second-type substrate; and
      a second-type+ isolation ring formed in the substrate to isolate the first-type epitaxial pocket;
   a gate drive circuit including a first input, a second input and an output, wherein the output of the gate drive circuit is coupled across a gate and a source of the switch; and
   a comparator including an output, a first input and a second input, wherein an output of the comparator is coupled to the second input of the gate drive circuit, the first input of the comparator receives a reference signal and the second input of the comparator is coupled to the first-type epitaxial pocket which functions as a drain of the switch, and wherein the comparator provides a turn-on signal to the gate drive circuit when a signal at the second input of the comparator is below the reference signal, where the turn-on signal causes the gate drive circuit to provide another turn-on signal to the gate of the switch causing the switch to conduct current.

2. The integrated circuit of claim 1, wherein a channel of the DMOS cell shorts out a base-emitter junction of a parasitic PNP transistor when the switch is conducting.

3. The integrated circuit of claim 2, wherein a resistance of the channel of the DMOS cell works in conjunction with a resistance of the first-type epitaxial pocket to reduce a magnitude of the signal on the second input of the comparator.

4. The integrated circuit of claim 1, further comprising:
   a plurality of first-type+ regions formed in the first-type epitaxial pocket on either side of a body of the DMOS cell.

5. The integrated circuit of claim 1, further comprising:
   a pass transistor including a gate, a drain and a source, wherein the drain of the pass transistor is coupled to the drain of the switch and the source of the pass transistor is coupled to the second input of the comparator, and wherein the gate of the pass transistor is controlled to couple the drain of the switch to the second input of the comparator when a voltage at the drain of the switch is below a predetermined level.

6. The integrated circuit of claim 1, wherein the first-type epitaxial pocket is an N-type epitaxial pocket.

7. The integrated circuit of claim 1, wherein the second-type+ isolation ring is a P-type+ isolation ring.

8. An integrated circuit having negative potential protection, comprising:
   a switch, comprising:
      a double-diffused metal-oxide semiconductor (DMOS) cell formed in an N-type epitaxial pocket, wherein the N-type epitaxial pocket is formed in a P-type substrate; and
      a P-type+ isolation ring formed in the substrate to isolate the N-type epitaxial pocket;
   a gate drive circuit including a first input, a second input and an output, wherein the output of the gate drive circuit is coupled across a gate and a source of the switch; and
   a comparator including an output, a first input and a second input, wherein an output of the comparator is coupled to the second input of the gate drive circuit, the first input of the comparator receives a reference signal and the second input of the comparator is coupled to the N-type epitaxial pocket which functions as a drain of the switch, and wherein the comparator provides a turn-on signal to the gate drive circuit when a signal at the second input of the comparator is below the reference signal, where the turn-on signal causes the gate drive circuit to provide another turn-on signal to the gate of the switch causing the switch to conduct current.

9. The integrated circuit of claim 8, wherein a channel of the DMOS cell shorts out a base-emitter junction of a parasitic PNP transistor when the switch is conducting.

10. The integrated circuit of claim 9, wherein a resistance of the channel of the DMOS cell works in conjunction with a resistance of the first-type epitaxial pocket to reduce a magnitude of the signal on the second input of the comparator.

11. The integrated circuit of claim 10, further comprising:
   a plurality of N-type+ regions formed in the N-type epitaxial pocket on either side of a body of the DMOS cell.

12. The integrated circuit of claim 8, further comprising:
   a pass transistor including a gate, a drain and a source, wherein the drain of the pass transistor is coupled to the drain of the switch and the source of the pass transistor is coupled to the second input of the comparator, and wherein the gate of the pass transistor is controlled to couple the drain of the switch to the second input of the comparator when a voltage at the drain of the switch is below a predetermined level.

13. The integrated circuit of claim 8, further comprising:
   a plurality of N-type+ regions formed in the N-type epitaxial pocket on either side of a body of the DMOS cell.

14. The integrated circuit of claim 13, further comprising:
   a pass transistor including a gate, a drain and a source, wherein the drain of the pass transistor is coupled to the drain of the switch and the source of the pass transistor is coupled to the second input of the comparator, and wherein the gate of the pass transistor is controlled to couple the drain of the switch to the second input of the comparator when a voltage at the drain of the switch is below a predetermined level.

15. An integrated circuit having negative potential protection, comprising:
   a switch, comprising:
      a double-diffused metal-oxide semiconductor (DMOS) cell formed in a first-type epitaxial pocket, wherein the first-type epitaxial pocket is formed in a second-type substrate, and wherein the first-type epitaxial pocket is an N-type epitaxial pocket; and
      a second-type+ isolation ring formed in the substrate to isolate the first-type epitaxial pocket;
   a gate drive circuit including a first input, a second input and an output, wherein the output of the gate drive circuit is coupled across a gate and a source of the DMOS cell; and
   a comparator including an output, a first input and a second input, wherein an output of the comparator is coupled to the second input of the gate drive circuit, the first input of the comparator receives a reference signal and the second input of the comparator is coupled to the first-type epitaxial pocket which functions as a drain of the switch, and wherein the comparator provides a turn-on signal to the gate drive circuit when a signal at the second input of the comparator is below the reference signal, where the turn-on signal causes the gate drive circuit to provide another turn-on signal to the gate of the switch causing the switch to conduct current.

16. The integrated circuit of claim 15, wherein a channel of the DMOS cell shorts out a base-emitter junction of a parasitic PNP transistor when the switch is conducting.

17. The integrated circuit of claim 16, wherein a resistance of the channel of the DMOS cell works in conjunction with a resistance of the first-type epitaxial pocket to reduce a magnitude of the signal on the second input of the comparator.

18. The integrated circuit of claim 15, further comprising:
   a plurality of N-type+ regions formed in the N-type epitaxial pocket on either side of a body of the DMOS cell.

19. The integrated circuit of claim 15, further comprising:
   a pass transistor including a gate, a drain and a source, wherein the drain of the pass transistor is coupled to the drain of the switch and the source of the pass transistor is coupled to the second input of the comparator, and wherein the gate of the pass transistor is controlled to couple the drain of the switch to the second input of the comparator when a voltage at the drain of the switch is below a predetermined level.

20. The integrated circuit of claim 15, wherein the second-type+ isolation ring is a P-type+ isolation ring.

* * * * *